United States Patent [19]

Okamoto et al.

[11] Patent Number: 4,682,152
[45] Date of Patent: Jul. 21, 1987

[54] DIGITAL DATA COMPANDING

[75] Inventors: Hiroo Okamoto; Takao Arai, both of Yokohama; Takashi Hoshino, Fujisawa, all of Japan

[73] Assignee: Hitachi, Ltd., Tokyo, Japan

[21] Appl. No.: 368,868

[22] Filed: Apr. 15, 1982

[30] Foreign Application Priority Data

Apr. 20, 1981 [JP] Japan ................................. 56-58532
Mar. 12, 1982 [JP] Japan ................................. 57-37986

[51] Int. Cl.⁴ ............................................ H03M 7/50
[52] U.S. Cl. ............................. 340/347 DD; 364/722
[58] Field of Search ............... 340/347 DD; 235/310, 235/311; 364/715, 722, 718

[56] References Cited

U.S. PATENT DOCUMENTS

| | | | |
|---|---|---|---|
| 3,610,901 | 10/1971 | Lynch ................ | 340/347 DD UX |
| 3,863,248 | 1/1975 | Deschemes ................ | 340/347 DD |
| 4,058,676 | 11/1977 | Wilkes ................ | 340/347 DD UX |
| 4,062,014 | 12/1977 | Rothgordt ................ | 340/347 DD |
| 4,078,250 | 3/1978 | Windsor ................ | 235/310 |
| 4,267,579 | 5/1981 | Gross ................ | 364/718 |
| 4,326,260 | 4/1982 | Gross ................ | 364/718 |
| 4,342,245 | 8/1982 | Gross ................ | 364/718 |

OTHER PUBLICATIONS

"CCIR Study group report 647", 1974–1977, pp. 1–4.
Dubmowski, "IEEE Transactions on Communications", vol. COM26, No. 5, May 1978, pp. 660–664.

*Primary Examiner*—Charles D. Miller
*Attorney, Agent, or Firm*—Antonelli, Terry & Wands

[57] ABSTRACT

Digital companding without range bits involves comparison of a digital input with predetermined boundaries separating a plurality of numerical ranges, detection of a numerical range to which the digital input belongs, generation of an off-set unique to each numerical range, bit-shifting of the digital input, and addition of the bit-shifted input with the generated off-set to provide a companded digital output which is in one-to-one correspondence to the digital input. The off-set values are stored in a memory.

21 Claims, 6 Drawing Figures

DIGITAL DATA COMPANDING

The present invention relates to digital data companding (compression/expansion) and, more particularly, to digital data companding suitable for compressing a pulse code modulation (PCM) signal for recording or transfer and expanding the same for reproduction or retrieval.

It is common practice that an analog signal is converted into a digital signal, such as in a PCM system, for recording or transmission. The number of bits for recording or transmitting digital data is generally limited, and it is desirable to use the usable bits efficiently so as to maintain a high S/N ratio. For this purpose, compression of data is carried out, i.e., a higher level signal is more greatly attenuated relative to a lower level signal so that the maximum signal level is lowered. In reproducing the compressed signal, expansion of data is needed, i.e., a higher level signal is more greatly amplified relative to a lower level signal. The circuit including both compressing and expanding abilities is called a compander.

There have been proposed various methods for companding PCM signal. Among those, a non-uniform folded encoding system which is easy to design and is achieved by a simple circuit is mainly used for general applications.

Five-segment folded encoding compression system will first be described with reference to FIG. 1. In the figure, the abscissa x represents the input, while the ordinate y represents the conversion output. The input x is classified into five ranges: $x<-x2$, $-x2 \leq x < x1$, $-x1 \leq x \leq +x1$, $+X1 < x \leq +x2$, and $+x2 < x$. The boundary between adjacent ranges may belong to either one of the adjacent ranges. Since the characteristics for the ranges $0<x$ and $x<0$ are symmetric with respect to the origin, the case of $0<x$ will solely be described in the following. Input digital signal x is converted into digital signal y in accordance with a transforming equation $y = c1 \cdot x$ ($0 < x \leq x1$), $y = c2 \cdot x$ ($x1 < x \leq x2$) or $y = c3 \cdot x$ ($x2 \leq x$) depending on the magitude of x, where $ci = (\frac{1}{2})^m$ for a binary digital system. By choosing the constants as $c1 > c2 > c3$, e.g. $c1 = 1$, $c2 = \frac{1}{2}$ and $c3 = (\frac{1}{2})^2$, a low level signal is converted with higher accuracy, while a high level signal is converted with lower accuracy. In this way the number of bits needed to represent the maximum magnitude of the data can be reduced, resulting in compression of the data. In other words, low level input data is given a fine quantitization, while high level input data is given a coarse quantitization, thereby providing with a smaller number of bits the equivalent effect as provided in the case with a larger number of bits. As shown in FIG. 1, three segments of different quantization accuracy (which can be represented by the slope), S(1), S(2) and S(3), represent the input/output relationship. Strictly speaking, these segments are not continuous, but are plots. There are cases where a value of y involves more than one segment, and therefore compressed data needs to be accompanied by a range signal indicating the segment to which the data belongs.

In reproducing the original signal x from the compressed data y, the segment to which the data y belongs is identified by the range signal and the original signal x is reproduced in accordance with the transformation function designated for the identified segment.

FIGS. 2A and 2B show examples of prior art circuits for compressing data as shown in FIG. 1. In the figures, the sign bit in the highest bit position in digital data applied to the input terminal 51 is delivered directly through the line 58 to the output terminal 52. The remaining low order bits are fed to the shift register 56 and the range finder 54. The range finder 54 compares the input signal with the boundary values for the input (x1 and x2 in FIG. 1) to determine which segment the input signal belongs to, and issues a range signal s to the shift register 56 and the range signal output terminal 53. In FIG. 2A, the range finder 54 includes a comparator 46 for comparing the input signal x with the first reference (boundary) value x1, a comparator 47 for comparing the input signal x with the second reference (boundary) value x2, and a decoder 48 for producing the range signal s based on the outputs from the comparators 46 and 47. In FIG. 2B, the range finder 54 includes a comparator 49 and a control circuit 44 which provides the reference values x1 and x2 sequentially to the comparator 49. The input data x loaded into the shift register 56 is shifted to the left by a certain number of bits (n-left shifts being equivalent to an operation of $x/2^n$) according to the range signal s from the range finder 54 so that the low order bits are truncated for compression. For example, input data belonging to segment S(1) ($0 < x \leq x1$) is not shifted ($y=x$), but data belonging to segment S(2) ($x1 < x \leq x2$) is shifted to the left by one bit ($y = x/2$) and data belonging to segment S(3) ($x2 < x$) is shifted to the left by two bits ($y = x/4$).

For expanding the compressed data, data y is loaded into the shift register and shifted to the right by a certain number of bits according to the range signal with a zero (0) bit being added at each shifting, then the expanded date ($x = 2^n y$) is produced.

If the range signal is not used, the segment to which the output y belongs cannot be identified and hence compressed data cannot be re-expanded correctly. Therefore, range bits are provided separately.

This method, however, needs many range bits for carrying out a complex folded-encoding compression. In addition, if it is intended to use all data efficiently, selection of the boundaries of respective segments is very limited. These are disadvantageous in recording or transmitting much data using less bits.

It is an object of the present invention to provide non-uniform folded-encoding companding which performs sophisticated companding efficiently with less data bits for recording and transmitting data.

According to one aspect of the present invention, compressed data is offset so that it corresponds to the input in one-to-one correspondence, whereby to achieve efficient non-uniform folded-encoding companding without using range bits. It will be obvious that the one-to-one correspondence does not hold to the low order bits which are truncated in the compressing process. Since no overlapping occurs in compressed data, the range signal is not needed and, moreover, the request for the limited selection of boundary values for respective ranges (segments) is eliminated. Accordingly, the polygonal line approximation which fits the desired companding characteristics can be configured arbitrarily.

Other objects, features and advantages of this invention will become apparent in the following detailed description of the preferred embodiments made in conjunction with the accompanying drawings, in which.

Figure 1:
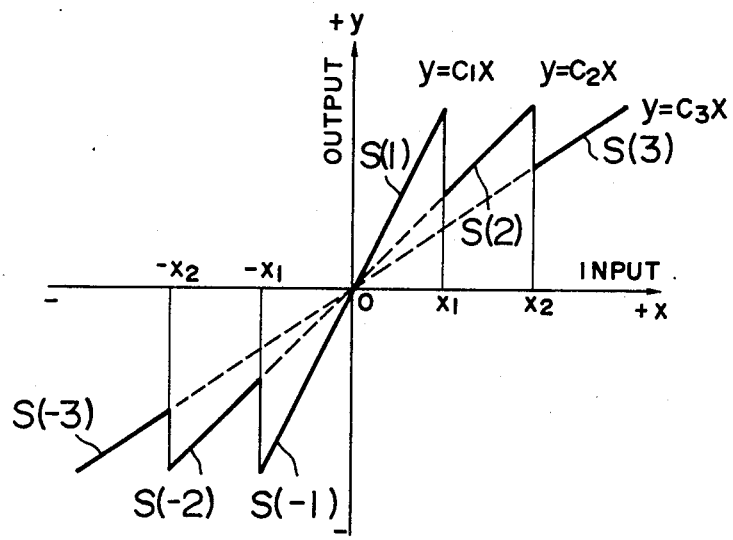
FIG. 1 is a graph illustrating conventional folded data compression.

The data compressing process embodying the present invention will now be described in connection with FIG. 3 which illustrates five-segment companding as in the case of FIG. 1. The abscissa x and ordinate y of the graph represent the input and output, respectively. Since the companding characteristics for the input ranges $0 < x$ and $x < 0$ are symmetric with respect to the origin, the former case will solely be described in the following. The input x is classified by boundary values x1 and x2 into three ranges each having a separate quantizing accuracy. Segments S(1), S(2) and S(3) represent transformation functions, $y = c1 \cdot x$, $y = c2 \cdot x + a2$ and $y = c3 \cdot x + a3$, corresponding to the three input ranges. Thus, the input is subjected to offset by +0, +a2 and +a3 as well as to scaling by xc1, xc2 ad xc3, respectively. The scaling factors c1, c2 and c3 are chosen to satisfy $c1 > c2 > c3$, so that the higher level input signal is more compressed. The offset factors a2 and a3 are chosen so that the y (and x) values of the segments S(1), S(2) and S(3) do not overlap with each other. In the embodiment shown in FIG. 3, the offset factors are chosen such that the segments S(1) and S(2) would join at the boundary x1, and the segments S(2) and S(3) would join at the boundary x2. The input and output correspond in one-to-one relationship, without causing an overlap in a value of y, and thus the range signal is not necessary. In addition, boundaries for partitioning the whole input range can be set arbitrarily.

The input signal x is first subjected to discrimination to determine which segment it belongs to, and it is then converted into the output signal y by a transforming equation $y = c1 \cdot x$, $y = c2 \cdot x + a2$ or $y = c3 \cdot x + a3$ corresponding to the designated segment. For example, if the input x resides in the input range of $x1 < x \leq x2$, the output signal y is formed according to the transforming equation $y = c2 \cdot x + a2$. In the transforming process multiplication ($\times c2$) and addition ($+a2$) can be carried out in an arbitrary order.

In the expanding process, the input y is converted into the output x in accordance with the inverse transforming equations, $x = y/c1$, $x = (y-a2)/c2$ (i.e. $x = y/c2 - a2/c2$), and $x = (y-a3)/c3$ (i.e. $x = y/c3 - a3/c3$), with the boundary values being $y1 = c1 \cdot x1$ and $y2 = c2 \cdot x2 + a2$. The order of multiplication (division in the above equations) and addition (subtraction) is arbitrary as in the case of the compressing process. In general, the factors c2 and c3 are smaller than one, and thus the result of multiplication $(1/c3) \times y$ can exceed the maximum value $x_M$ for the original signal x. However, this over-scaling can be anticipated without increasing the complexity of the circuit.

Table 1 shows an example of the compressing process, in which the input signal x has 14 bits (numerical range: 0-8191) and the output signal y has 13 bits (numerical range: 0-4095) with boundary values being set to $x1 = 1023$, $x2 = 6143$ and $x_M = x3 = 8191$ (the sign bit is omitted).

TABLE 1

| Input Range | Compression | Input data x | Compressed data y | Transforming equation |
|---|---|---|---|---|
| (1) | 14 bits to 14 bits | 0–1023 | 0–1023 | $y = x$ |
| (2) | 14 bits to 13 bits | 1024–6143 | 1024–3583 | $y = x/2 + 512$ |
| (3) | 14 bits to 12 bits | 6144–8191 | 3584–4095 | $y = x/4 + 2048$ |

Figure 3:
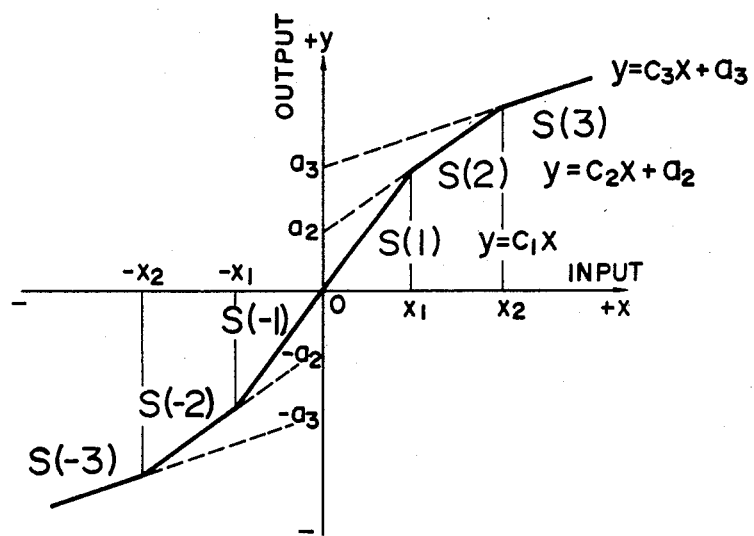
FIG. 3 is a graph illustrating data compression according to an embodiment of this invention.

The transformation function shown in FIG. 3 is nonlinear as the whole, however, it is linear within each segment. Therefore, it will be apparent that linear circuitries can be used in various applications.

Figure 5:
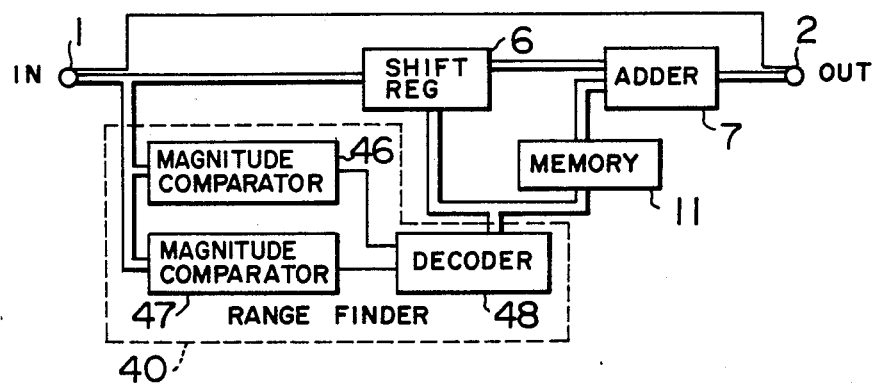
FIGS. 4 and 5 are block diagrams of compandor circuits capable of achieving the data compression and expansion illustrated in FIG. 3 according to embodiments of this invention.
Figure 4:
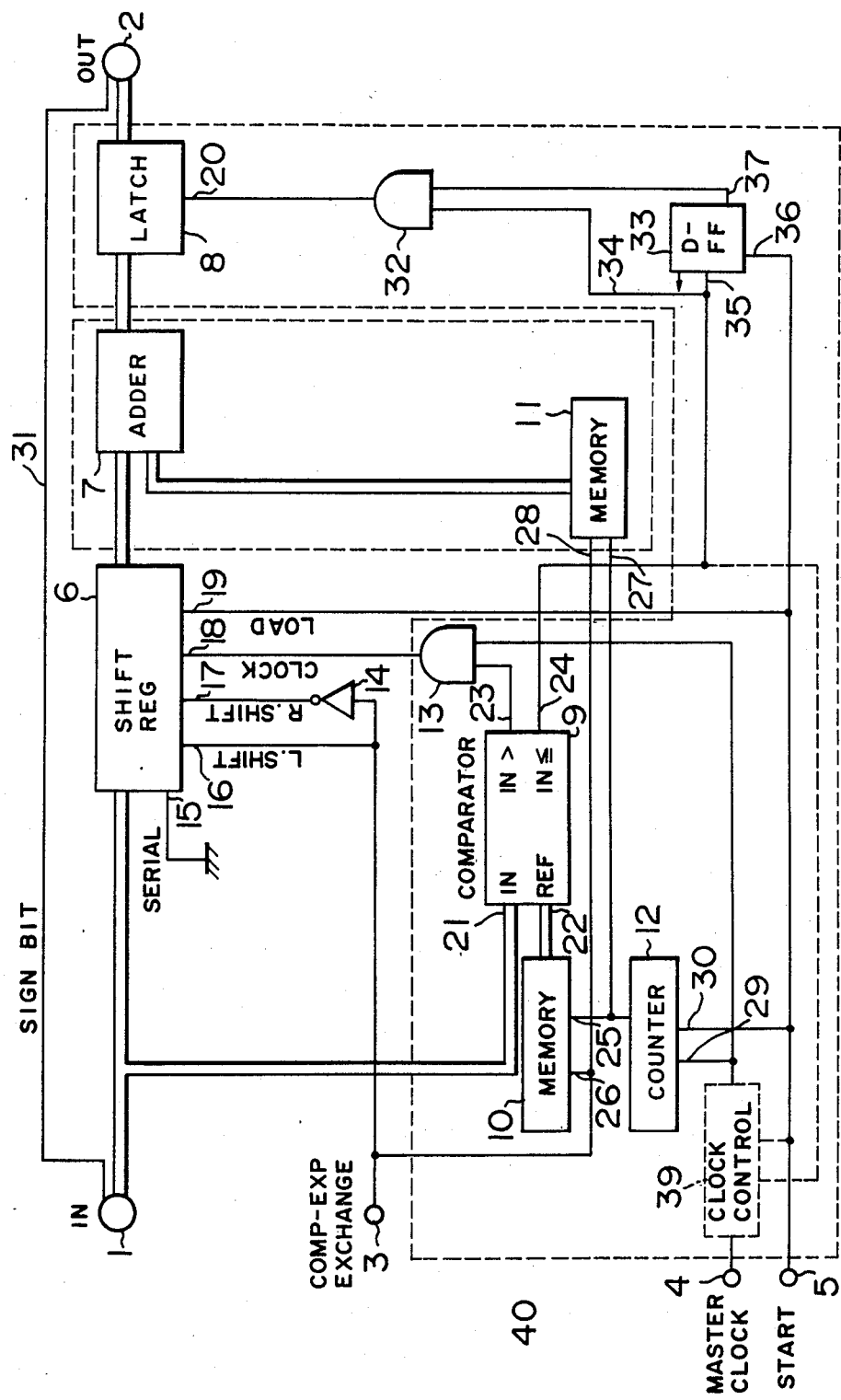

Next, embodiments of the circuit for carrying out the foregoing data companding process will be described with reference to FIGS. 4 and 5. FIG. 4 shows the case using one comparator, whereas FIG. 5 is the case using a plurality of comparators.

In FIG. 4, a digital input terminal 1 is connected to and supplies digital input data x to a shift register 6 and a comparator 9. An output terminal 2 is connected to a latch cicuit 8 and also to a sign bit line 31, and sends out a digital output y. The mode input terminal 3 for the compression/expansion switching signal is connected directly and through an inverter 14 to the shift register 6 and is also connected to memories (e.g. ROMs) 10 and 11, so that the switching signal designates the compression operation or expanding operation. A clock input terminal 4 for the master clock signal is connected to a counter 12 and an AND gate 13, so that the clock signal provides the timing for input range discrimination. An input terminal 5 for the start signal is connected to the counter 12, shift register 6 and D-type flip-flop 33, so that the signal initializes or resets the whole circuit upon receipt of a new input. The shift register 6 has a grounded serial input terminal 15 for entering 0's bits and for truncating the low order bits, right and left shift signal input terminals 17 and 16 for selecting the right shift or left shift operation, clock signal input terminal 18 for carrying out the bit-shift operation, and load signal input terminal 19 for fetching new data. An adder 7 is connected to the output of the shift register 6 and the output of the memory 11, so that an offset value from the memory 11 can be added to the compressed data from the shift register 6. The resultant data is fed to the latch circuit 8.

In the compressing process, a signal which has been converted into digital data by an A/D converter (not shown in the figure) is applied to the input terminal 1. The sign bit in the highest bit position of the input data is conducted directly through the line 31 to the output terminal 2. The remaining low order 13 bits are fed to the shift register 6 and the magnitude comparator 9. When the start signal is applied to the start signal input terminal 5, the circuit starts operating by loading the input data into the shift register 6 and clearing the counter 12 and flip-flop 33. The memories 10 and 11 have received and stored in advance the boundary values (x1, x2, xM) and offset values (a1 = 0, a2, a3), respectively. The boundary values and offset values are read out from the memories 10 and 11 in response to the output of the counter 12 which is the input range number obtained by counting the master clock signal entered through the master clock terminal 4. When the first master clock pulse is given, the first boundary value x1 (e.g. 1023) is read out of the memory 10 and is compared with the input data x from the input terminal 1 by the comparator 9. If the input data x at the comparator input terminal 21 is larger than the reference signal x1, the output 23 of the comparator 9 provides a high level. This high level signal is fed via an AND gate 13 to the clock input terminal 18 of the shift register 6, whose contents are then shifted to the left by one bit. If the input data x is smaller than the reference signal x1, the data x is discriminated to belong to the first input range ($0 < x \leq x1$), causing another output 24 of the comparator 9 to go high level. This signal triggers the latch circuit 8 through an AND gate 32, so that the input data added by the offset value (zero offset for the first input range) by the adder 7 is latched and delivered to the output terminal 2. Thus, the data transformation as shown by the segment S(1) of FIG. 3 is carried out. At the same time, the D-type flip-flop 33 provides a low level at its output 37 so that the latch circuit 8 does not latch the subsequent incoming signal.

When the next master clock is issued, the comparator 9 compares the input data x with the boundary value x2 (e.g. 6143) between the second and third input ranges. If the input data is larger than x2, the shift register 6 further shifts the contents to the left by one bit. If the input data does not exceed x2, the data is discriminated to reside in the second input range ($x1 < x \leq x2$) and the input data shifted by one bit (i.e. x/2) and increased in value by the offset value for the second segment S(2) (i.e. $a2 = 512$; thus $y = x/2 + 512$) is delivered to the output terminal 2.

When the last master clock is issued, the input data x is compared with the highest level, $x3 = 8191$. The input data is obviously not larger than x3, and the input data shifted by two bits and increased in value by the offset value for the third segment S(3) (i.e. $a3 = 2048$; thus $y = x \cdot 4 + 2048$ is delivered to the output terminal 2. The compression operation is then completed. It will be understood that the output data y has 13 bits including the highest order sign bit and 12 lower order bits.

By choosing the offset values properly (these are 0, 512 and 2048 in the foregoing example), compressed data may be contiguous at the boundary of segments. Alternatively, they may have a gap at the boundary. The offset value varies depending on the boundary values of segmented lines.

Since no overlapping occurs in compressed data, it can be expanded through a process similar to the compressing process. In this case, the sign bit in the highest bit position in 13-bit compressed data is outputted directly, and a zero bit is added to the low order 12-bit data from the serial input 15 of the shift register 6 whereby to make up a 13-bit data.

In the expanding process, boundary values (y1 and y2), offset values and data shift direction are different from those of the compressing process. These factors are switched by the compression/expansion switching signal, which may be produced, for example, by operating the recording/reproduction switch such that the high level signal is applied to the left-shift terminal 16 of the shift register 6 for recording (compression), while the low level signal is inverted by the inverter 14 and applied to the right-shift terminal 17 for reproduction (expansion). The offset value is subtracted in the expanding process, and this operation can be carried out in a similar way as in the compressing process by storing the negative offset values in the ROM 11. Similar to the compression, the order of subtraction (addition) and multiplication (division) may be changed.

Due to the one-to-one correspondence between input data and compressed data, range bits are not required and switching points of segments can be set arbitrarily. Moreover, both of the compressing and expanding operations can be carried out by the same circuit.

It has been described that the range of input data is identified by the single comparator 9 and resultant data is latched at each comparison, however, output data may be obtained by other method. For example, a clock control circuit 39 (shown by the dashed block in FIG. 4) may be provided in the clock signal path instead of using the D-type flip-flop 33, AND gate 32 and latch circuit 8, so that the output of the adder 7 is fixed by halting the clock signal.

Figure 2A:
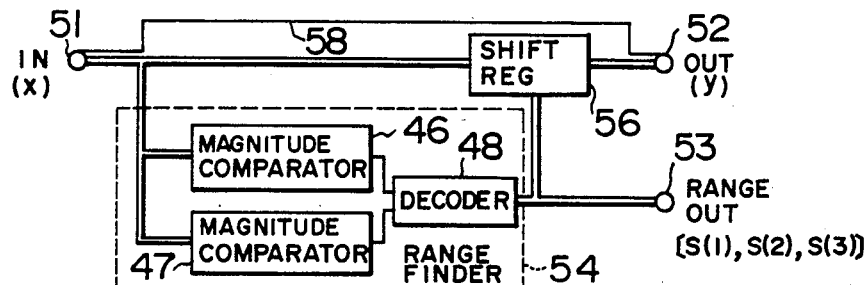
FIGS. 2A and 2B are block diagrams of examples of conventional data compressor for carrying out the folded data compression of FIG. 1.
Figure 2B:
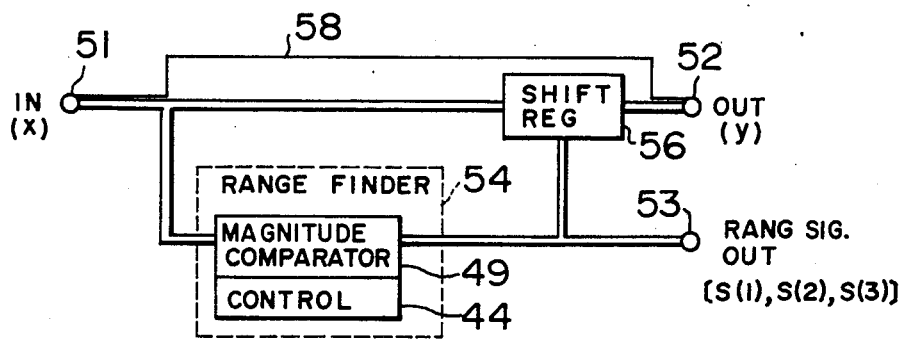

FIG. 5 shows another embodiment of the companding circuit, wherein a plurality of comparators are used for comparing boundary values separately. Also in this case, the latch circuit and the accompanied components can be eliminated. In FIGS. 2A, 4 and 5, like numbers signify like circuit components. The first comparator 46 compares input signal x with the first reference value x1, while the second comparator 47 compares the input signal x with the second reference value x2. The outputs of both comparators are converted into a range signal by the decoder 48, then delivered to the shift register 6 and memory 11. The offset value supplied from the memory 11 is added to the compressed (expanded) signal which has been shifted in accordance with the identified input range, and the resultant compression output y is delivered to the output terminal 2. It will be appreciated that the decoder 48 can be eliminated if the shift register 6 and memory 11 are driven directly by the output of the comparators 46 and 47.

As described above, the present invention eliminates the need for range bits and allows arbitrary setting of boundaries in a non-uniform folded companding, whereby data can be compressed efficiently. Moreover, the compressing and expanding operations can be carried out by the same circuit.

We claim:

1. A reversible compressor-expander circuit for transforming a digital input signal into another digital signal having a reduced number of bits in the case of compressing and an increased number of bits in the case of expanding, comprising:
   a digital input terminal for receiving a digital input signal of a first number of bits;
   means for classifying the digital input signal in one of a number of predetermined ranges according to the magnitude of the digital input signal, including memory means for storing the boundary values of adjacent ranges;
   means for transforming the digital input signal into an intermediate signal with a predetermined scaling assigned to the designated range by shifting the bit positions of said digital input signal to a lower order in the case of compressing and to a higher order in the case of expanding;
   means for providing a predetermined off-set value assigned to the designated range; and
   means for adding said intermediate signal and said off-set value to provide said another digital signal, the off-set value being so selected that said another digital signal increases continuously with the increase of said digital input signal, whereby each value of said output signal represents only one possible value of a received input signal.

2. A circuit according to claim 1, wherein said transforming means comprises a shift register.

3. A circuit according to claim 1, wherein said classifying means includes a plurality of comparators which compare the magnitude of the input signal with respective boundary values.

4. A circuit according to claim 1, wherein said classifying means includes a terminal connected to receive a control pulse of predetermined timing, a reference signal generator for generating a predetermined reference signal in response to said control pulse, and a comparator for comparing the magnitude of the digital input signal with said reference signal.

5. A circuit according to claim 3 or 4, wherein said off-set generating means includes a memory storing said off-set value.

6. A circuit according to claim 4, further comprising a latch circuit connected to said adding means for latching the output of said adding means.

7. A digital circuit for compressing or expanding the bit length of a digital input signal, comprising:
   a digital input terminal for receiving a digital input signal of a first number of bits;
   means including a memory which stores boundary values of a group of numerical ranges for comparing the digital input signal with said boundary values and for designating one of the numerical ranges to which the digital input signal belongs;
   means for compressing or expanding the digital input signal by right-shifting or left-shifting, respectively, the bit positions of said input signal to provide an intermediate compressed signal or expanded signal which has a reduced or increased number of bits, respectively;
   means for producing a predetermined off-set value assigned to the designated range; and
   means for adding said intermediate compressed or expanded signal and said off-set value to provide a compressed or expanded digital output signal, the off-set value being so selected that said digital output signal increases continuously with the increase of said digital input signal, whereby each value of said output signal represents only one possible value of a received input signal.

8. A digital circuit for expanding or compressing the bit length of a compressed or expanded digital input signal having no range bit, comprising:
   a digital input terminal for receiving a digital input signal of a first number of bits;
   means including a memory which stores boundary values of a group of numerical ranges for comparing the digital input signal with said boundary values and for designating one of the numerical ranges to which the digital input signal belongs;
   means for expanding or compressing the digital input signal by left-shifting or right shifting the bit positions of the input signal, respectively, to provide an intermediate expanded signal which has an increased or decreased number of bits;
   means for producing a predetermined off-set value assigned to the designated range; and
   means for subtracting or adding said off-set value from said intermediate expanded signal to provide an expanded or compressed digital output signal.

9. A method of compressing or expanding an electrical digital input signal representing an analog quantity, comprising the steps of:
   storing digital signals representing boundary values of a plurality of input numerical ranges of values and an equal number of output numerical ranges of values of a digital signal, each of the output numerical ranges of values corresponding to a unique one of the input numerical ranges of values;
   comparing a digital input signal with said digital signals representing boundary values of said input numerical ranges of values and designating an input numerical range to which the digital input signal belongs;
   compressing or expanding the digital input signal according to the scale of an output numerical range of values corresponding to said designated input numerical range of values by shifting the digit positions of the input signal to a lower order or higher order, respectively;
   providing a digital signal representing a predetermined off-set value unique to said corresponding output range; and
   adding said shifted digital input signal and said digital signal representing said off-set value in the case of compressing and subtracting said offset value from said shifted digital input signal in the case of expanding to provide a biased digital output signal, said off-set value being so selected that said biased digital output signal increases continuously with the increase of said digital input signal.

10. A method for compressing and expanding an input binary electric digital signal of m bits into an output binary electric digital signal of n bits, where $m \neq n$, comprising the steps of:
    receiving the input binary electric digital signal of m bits;
    comparing the input digital signal with signals representing a set of predetermined boundary values and generating a range signal indicating between which pair of the boundary values the input digital signal is located;
    supplying a shift signal in response to and depending on said range signal;
    shifting the bit positions of said input digital signal by a number of bits determined by the range signal, thereby generating a shifted digital signal of n bits;
    supplying a digitalized off-set signal of not higher than n bits in response to and depending on said range signal; and
    adding said shifted digital signal of n bits and said off-set digital signal to generate said output binary electric digital signal of n bits;
    where said binary digital signals represent analog quantities and said off-set digital signal is so selected that the output signal increases continuously with an increase of the input signal.

11. A method according to claim 10, wherein said step of shifting the bit positions is comprised of right shifting when m>n, and of left shifting when m<n.

12. A method according to claim 10, wherein said step of receiving the input digital signal includes storing the input digital signal in a shift register.

13. A method according to claim 12, wherein said comparing and generating step includes comparing the input digital signal with the boundary values successively and generating a trigger signal when the boundary signal first becomes equal to or exceeds the input signal.

14. A method according to claim 13, wherein said comparing and generating step further includes generating a detection signal when the boundary signal is smaller than the input signal.

15. A method according to claim 14, wherein said step of supplying a shift signal includes taking an AND result of said detection signal and a clock signal.

16. A circuit for transforming a digital input signal into another digital signal having a different number of bits to effect compressing or expanding of the input signal, the input and another digital signal representing analog quantities x and y, comprising:
a digital input terminal for receiving a digital input signal of m bits;
means for classifying the digital input signal to one of a number of predetermined ranges according to the magnitude of the analog quantity x;
means for transforming the digital input signal into an intermediate signal of n bits, where m≠n, the intermediate signal including said input signal multiplied by $2^i$ where i is an integer having both positive and negative values;
means for generating a predetermined off-set value assigned to the designated range and having l bits, where $l \leq n$; and
means for adding said intermediate signal and said off-set value to provide said another digital signal of n bits representing the analog quantity y the off-set value being so selected that when x and y are plotted on X and Y axes of a Cartesian coordinate system, y increases continuously with the increase of the analog quantity x over the ranges.

17. A circuit according to claim 16, wherein said transforming means comprises a shift register.

18. A circuit according to claim 16, wherein said classifying means includes a memory for storing boundary value of adjacent ranges.

19. A circuit according to claim 16, wherein said classifying means includes at least one comparator which has two inputs for receiving the digital signal and a boundary signal representing a boundary of adjacent ranges.

20. An expander and compressor circuit for transforming a digital input signal into another digital signal having an increased or decreased number of bits, comprising:
a digital input terminal for receiving a digital input signal of a first number of bits;
means for classifying the digital input signal in one of a number of predetermined ranges according to the magnitude of the digital input signal, including memory means for storing the boundary values of adjacent ranges;
means for transforming the digital input signal into an intermediate signal with a predetermined scaling assigned to the designated range by shifting the bit positions of said digital input signal to a higher order in the case of expanding and a lower order in the case of compressing;
means for providing a predetermined off-set value assigned to the designated range; and
means for subtracting said offset value from said intermediate signal in the case of expanding and adding said offset value to said intermediate signal in the case of compressing to provide said another digital signal, the off-set value being so selected that said another digital signal increases continuously with the increase of said digital input signal, whereby each value of said output signal represents only one possible value of a received input signal.

21. A method of compressing and expanding an electrical digital input signal representing an analog quantity, comprising the steps of:
storing digital signals representing boundary values of a plurality of input numerical ranges of values and an equal number of output numerical ranges of values of a digital signal, each of the output numerical ranges of values corresponding to a unique one of the input numerical ranges of values;
comparing a digital input signal with said digital signals representing boundary values of said input numerical ranges of values and designating an input numerical range to which the digital input signal belongs;
expanding or compressing the digital input signal according to the scale of an output numerical range of values corresponding to said designated input numerical range of values by shifting the digit positions of the input signal to a higher order in the case of expanding and to a lower order in the case of compressing;
providing a digital signal representing a predetermined off-set value unique to said corresponding output range; and
subtracting said digital signal representing said off-set value from said shifted digital input signal in the case of expanding and adding the offset value to the shifted digital input signal in the case of compressing to provide a biased digital output signal, said off-set value being so selected that said biased digital output signal increases continuously with the increase of said digital input signal.

* * * * *